United States Patent
Marbot et al.

(10) Patent No.: US 7,580,496 B2
(45) Date of Patent: Aug. 25, 2009

(54) DEVICE FOR RECEIVING SERIES DATA

(75) Inventors: Roland Marbot, Sassenage (FR); Franck Hellard, Grenoble (FR)

(73) Assignee: STMicroelectronics, SA, Montrouge (FR)

( * ) Notice: Subject to any disclaimer, the term of this patent is extended or adjusted under 35 U.S.C. 154(b) by 713 days.

(21) Appl. No.: 10/832,803

(22) Filed: Apr. 26, 2004

(65) Prior Publication Data

US 2004/0247045 A1    Dec. 9, 2004

(30) Foreign Application Priority Data

Apr. 25, 2003   (FR) .................................. 03 05113

(51) Int. Cl.
    *H03D 3/24*    (2006.01)
(52) U.S. Cl. .................... 375/373; 375/375; 375/376
(58) Field of Classification Search ................ 375/354, 375/371, 355, 376, 373, 375
    See application file for complete search history.

(56) References Cited

U.S. PATENT DOCUMENTS

| | | | |
|---|---|---|---|
| 5,371,766 A | 12/1994 | Gersbach et al. | |
| 5,550,514 A | 8/1996 | Liendberg | |
| 5,974,097 A * | 10/1999 | Julyan et al. | ................. 375/340 |
| 6,271,777 B1 * | 8/2001 | Lentine et al. | ............... 341/100 |
| 6,304,071 B1 | 10/2001 | Popplewell et al. | |
| 6,999,544 B2 * | 2/2006 | Cranford et al. | ............ 375/360 |
| 2003/0041292 A1 * | 2/2003 | Lee et al. | ..................... 714/700 |
| 2003/0165201 A1 * | 9/2003 | Shahar et al. | ................ 375/316 |
| 2004/0037383 A1 * | 2/2004 | Song | ........................... 375/371 |

OTHER PUBLICATIONS

Dec. 12, 2003, French Search Report.

* cited by examiner

*Primary Examiner*—Chieh M Fan
*Assistant Examiner*—Jaison Joseph
(74) *Attorney, Agent, or Firm*—Graybeal Jackson LLP

(57) ABSTRACT

A circuit for receiving digital data arriving in series comprising a circuit for generating a reference dock and a circuit for oversampling the received data memorizing the samples sampled at the rate of several clocks phase-shifted with respect to the reference clock, the oversampling circuit comprising means for selecting and providing as output data samples representative of the received data and, further, a detection circuit identifying the variations of the phase shift between the reference clock edges and the transitions of the received data by analyzing the memorized samples, the detection circuit controlling a frequency variation of the reference dock when the phase shift variations repeat over several sampling cycles.

5 Claims, 5 Drawing Sheets

DEVICE FOR RECEIVING SERIES DATA

PRIORITY CLAIM

This application claims priority from French patent application No. 03/05113, filed Apr. 25, 2003, which is incorporated herein by reference.

BACKGROUND OF THE INVENTION

The present invention relates to circuits for receiving digital data arriving in series, and more specifically to the reception of digital data arriving with a variable frequency.

FIG. 1 is a diagram of a known receive circuit that comprises a "tracking" phase-locked loop circuit 1 providing a clock CLK activating a circuit (SAMPLER) 2 for sampling received data dr. Conventionally, circuit 1 comprises three elements connected in a loop: a phase detector 3, a filter circuit 4, and a voltage-controlled oscillator (VCO) 5. Phase detector 3 detects the phase shifts between rising edges of clock CLK and the transitions of the received data. Filter circuit 4 is a low-pass filter enabling filtering too fast phase variations that correspond to the input data jitter. As for voltage-controlled oscillator 5, it varies, after a given delay, the frequency of clock CLK under control of phase detector 3.

Sampler 2 provides as output data dS the samples of the received data dr sampled on each falling edge of clock CLK. The frequency of clock CLK being controlled by the frequency of the received data, the sequence of output data dS is thus normally identical to the sequence of received data dr.

When the frequency of the received data is stable, such a receive circuit operates very well once the edges of clock CLK of the tracking phase-locked loop circuit are in phase with the transitions of the received data. However, the use of such a receive circuit is much less reliable when the frequency of the received data varies. Indeed, for oscillator 5 to be able to vary the frequency of clock CLK sufficiently fast for its edges to be in phase with the transitions of the received data, filter circuit 4 must have a cut-off frequency much greater than that used in the case where the frequency is stable. The input noise is thus less filtered. The security margin is thus very reduced, or even non-existent, which may result in reception errors.

Further, the receive circuit often comprises analog circuits very sensitive to variations, especially of temperature and voltage, which results in generating noise on dock CLK and thus further decreasing the circuit reliability.

SUMMARY OF THE INVENTION

An embodiment of the present invention provides a circuit for receiving series data arriving with a variable frequency, which has a very low sensitivity to the received data jitter.

Another embodiment of the present invention provides such a receive circuit with a very low sensitivity to temperature and voltage variations.

Another embodiment of the present invention provides such a receive circuit having a relatively simple structure.

Another embodiment of the present invention provides a circuit for receiving digital data arriving in series comprising a circuit for generating a reference dock and a circuit for oversampling the received data memorizing the samples sampled at the rate of several clocks phase-shifted with respect to the reference clock, the oversampling circuit comprising means for selecting and providing as output data samples representative of the received data. The receive circuit further comprises a detection circuit identifying the variations of the phase shift between the reference clock edges and the transitions of the received data by analyzing the memorized samples, the detection circuit controlling a variation of the reference clock frequency when the phase shift variations are repeated over several sampling cycles.

According to another embodiment of the present invention, the clock generation circuit comprises two settable delay means receiving a base clock, the difference between the maximum and minimum delays of each delay means being greater than one period of the base dock; a multiplexer selecting the output signal of one or the other of the delay means; control means for, according to whether the reference clock frequency must be smaller or greater than the base clock frequency, increasing or decreasing at the rate of the base clock or at a multiple of this rate the delay of the selected delay means, and controlling a minimum or maximum delay for the non-selected delay means; and a phase comparator capable of changing the multiplexer selection when the transitions of the signals output by the delay means corresponding to a same transition of the base clock are shifted by a duration greater than or equal to one period of the base clock.

According to another embodiment of the present invention, the delay of the delay means is likely to vary by increments or decrements and the control means comprise means for setting the increment or decrement value.

According to an embodiment of the present invention, each delay means comprises several delay elements in series, the output of each delay element being connected to the output of the delay means via a switch, the input of the first delay element being connected to the input of the delay means.

According to an embodiment of the present invention, the phase comparator comprises two two-input NAND gates, the output of a NAND gate being connected to a first input of the other NAND gate, each NAND gate receiving on its second input one of the signals output by said delay means, one of these signals being transmitted to the control input of a first flip-flop via a non-inverting circuit exhibiting a delay, the output of one of the NAND gates being connected to the data input of the first flip-fop, the output of the first flip-flop controlling a second flip-flop having its output connected to its input via an inverter, the output of the second flip-flip controlling the multiplexer of the reference clock generation circuit.

According to an embodiment of the present invention, the delay of one of the delay means increases or decreases only for one or several cycles of a set of cycles of the input signal, the number of delay increases or decreases over a set of cycles being all the greater as the reference dock frequency is distant from the base clock frequency.

According to an embodiment of the present invention, the oversampling circuit comprises a multiple-phase clock generator providing several clocks phase-shifted with respect to the reference clock, a circuit for sampling the received data, sampling at the rate of said several docks, a buffer register memorizing the samples, a transition detection circuit analyzing the memorized samples and controlling a circuit for selecting the samples representative of the received data and controlling a circuit for selecting the clock corresponding to the selected samples, the selected samples being output at the rate of the selected clock.

BRIEF DESCRIPTION OF THE DRAWINGS

The foregoing and other features and advantages of the present invention will be discussed in detail in the following non-limiting description of specific embodiments in connection with the accompanying drawings.

DETAILED DESCRIPTION

Figure 1:
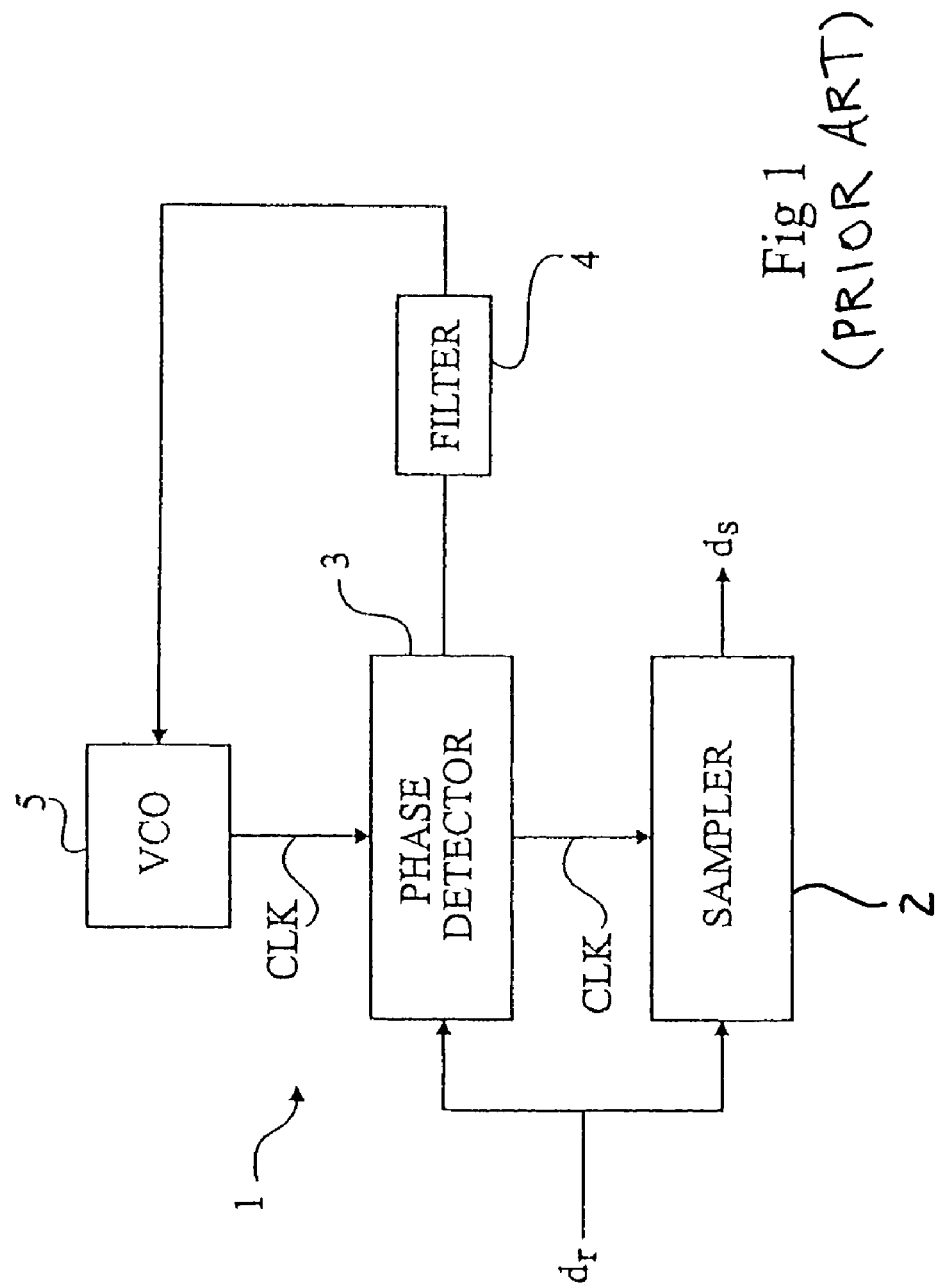
FIG. 1 is a diagram, previously described, of a data receive circuit according to the prior art.
Figure 2:
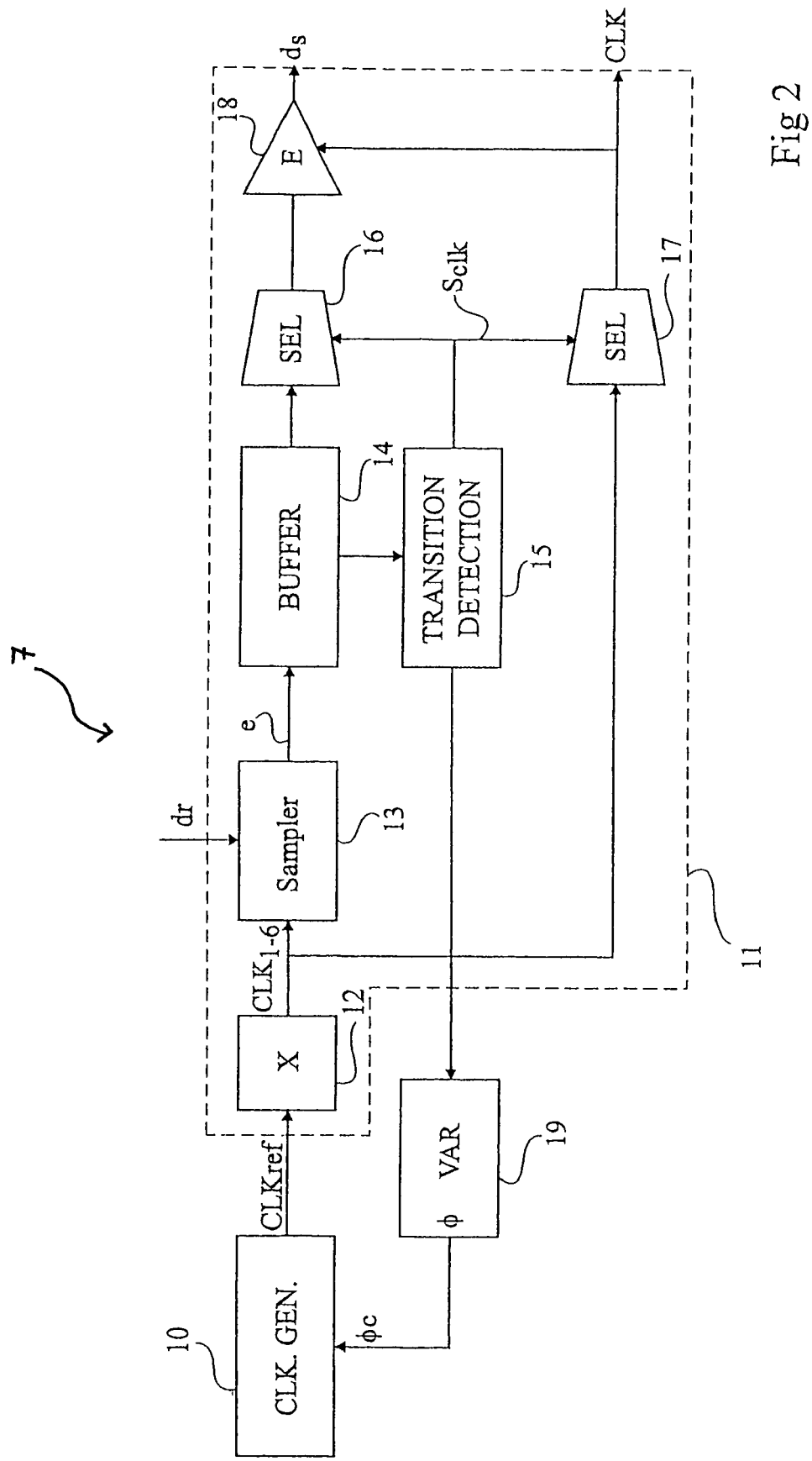
FIG. 2 is a diagram of a receive circuit according to an embodiment of the present invention.

FIG. 2 is a diagram of a circuit 7 for receiving data dr, arriving with a variable frequency fr. A clock generation circuit (CLK.GEN) 10 provides a reference clock CLKref to an oversampling circuit 11. Oversampling circuit 11 comprises a generator 12 (X) providing several phase-shifted clock signals, in this example, six clocks CLK1 to CLK6. Clocks CLK1 to CLK6 are shifted with respect to one another by approximately ⅙ of the period of reference clock CLKref. A sampling circuit 13 samples the received data dr on each rising edge of clocks CLK1 to CLK6. The samples are temporarily memorized in a buffer register 14. A transition detection circuit 15 analyzes the samples stored in buffer 14 to select one at each clock cycle CLKref. Transition detection circuit 15 provides a selection signal SCLK that controls a data selection circuit 16 and a clock selection circuit 17. Clock selection circuit 17 provides one of clocks CLK1 to CLK6 as the output clock CLKS. A transmit circuit 18 delivers as output data dS the samples selected by data selection circuit 16, under control of the clock selected by clock selection circuit 17.

According to an alternative embodiment of the receive circuit 7 of the present invention, the oversampling circuit comprises a "resilient buffer" that memorizes output data dS at the rate of clock CLKS. The memorized data are then provided with a different frequency often equal to the frequency of the circuit receiving the data.

According to a major aspect of this embodiment of the present invention, a phase-shift detection circuit 19 analyzes the memorized samples to determine whether the phase-shift between the edges of clock CLKref and the transitions of the received data increases or decreases. The detection circuit determines whether the phase-shift increase or decrease is random and ephemeral or whether it repeats over several cycles. In the first case, the phase-shift variation corresponds to the jitter of the received data. In the second case, the phase-shift variation corresponds to a variation in the frequency of the received data. Phase-shift detection circuit 19 sends a control signal φC to clock generation circuit 10 so that it increases or decreases the frequency of clock CLKref in the second case only.

The use of an oversampling circuit and of a buffer memorizing the samples over several clock cycles enables controlling a frequency change of clock CLKref only when the frequency of the received data has effectively varied. This detection circuit is thus equivalent to a filter having a very low cut-off frequency, which enables being insensitive to the jitter of the received data.

Figure 3:
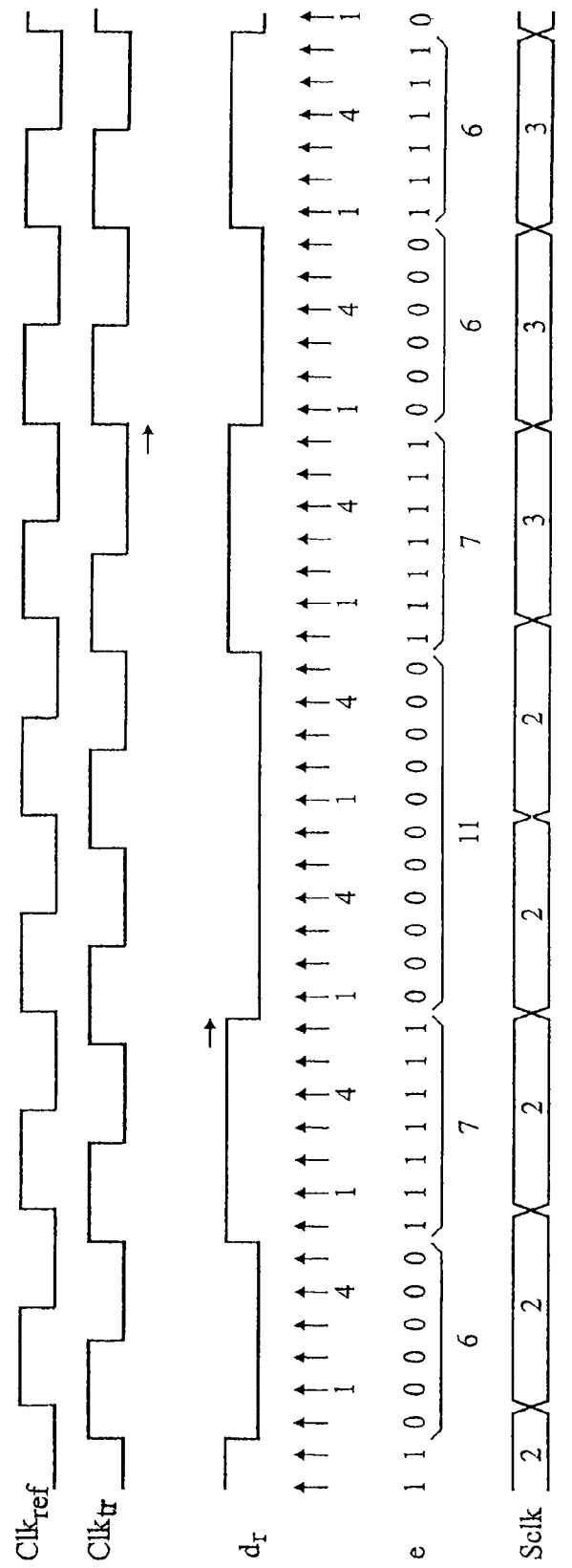
FIG. 3 is a diagram illustrating the signals at various points of the receive circuit of FIG. 2.

This major aspect of this embodiment of the present invention is detailed in relation with FIG. 3 that illustrates an example of operation of the circuit of the present invention.

FIG. 3 is a diagram representing reference clock CLKref, received data dr, sampled values e, clock selection signal SCLK, and a transmission clock CLKtr used to transmit received data dr. Seven cycles of clocks CLKref and CLKtr are shown entirely.

Conventionally, a decrease in the frequency of clock CLKtr is obtained by increasing the period of a cycle of clock CLKtr while maintaining a fixed period over several consecutive cycles. Over all of these cycles, clock CLKtr has a smaller average frequency. In the example shown, in FIG. 3, the first four shown complete cycles of clock CLKtr have an identical period, equal in this example to 1 ns. The fifth clock cycle has a longer period equal to ⅞ ns. The last two shown complete cycles of clock CLKtr have an identical period equal to 1 ns. The frequency of clock CLKref is constant during the seven shown cycles, the period of a cycle being equal to 1 ns. The first five rising edges of clock CLKref and of clock CLKtr are out of phase by ⅙ ns. The sixth and seventh rising edges of clock CLKref and of clock CLKtr are in phase.

The received data dr take value 0 over the entire first shown cycle of clock CLKtr, value 1 over the second cycle, value 0 over the third and fourth cycles, value 1 over the fifth cycle, value on the sixth cycle, and value 1 over the seventh cycle.

Arrows shown under the signal of received data dr show the rising edges of clocks CLK1 to CLK6. In this example, the rising edge of clock CLK1 is shifted with respect to the rising edge of clock CLKref by 1/12 ns, the rising edge of clock CLK2 is shifted by ⅙ ns with respect to the rising edge of clock CLK1, the rising edge of clock CLK3 is shifted by ⅙ ns with respect to the rising edge of clock CLK2, and so on. In the example shown, received data dr switch from one value to another on the rising edge of clock CLKtr, except for the first switching from value 1 to 1, which is delayed by 1/13 ns with respect to the third shown rising edge of clock CLKtr. This phase shift for example corresponds to noise.

The first shown integral value of the received data is sampled at "0" over six consecutive rising clock edges (CLK6, CLK1, CLK2, CLK3, CLK4, CLK5). The second value of received data dr is sampled at "1" during seven consecutive rising clock edges, from CLK6 to CLK6. The next value 0 of the received data dr is sampled at "0" during eleven consecutive rising clock edges. The next value 1 is sampled at "1" during seven consecutive rising clock edges. The next value "0" is sampled at "0" for six consecutive rising clock edges and the next value "1" is sampled at "1" for six consecutive rising clock edges.

After analyzing the memorized samples, the receive circuit of this embodiment of the present invention can recognize the noise having caused the sampling of the first value "1" seven times instead of six, noting that the two consecutive values at "0" have been sampled at "0" eleven times instead of twelve. The receive circuit may further detect the frequency decrease of clock CLKtr corresponding to the second shown value "1" of received data dr, since the seven samples at "1" are followed not by five samples at "0", but by six samples. Further, the last sample at "1" is also sampled six times at "1", which confirms that the phase shift of received data dr does correspond to a frequency decrease and not to noise.

During the first four cycles of clock CLKref, clock selection signal Sclk indicates clock CLK2 to select the "middle" sample corresponding to the sample sampled at mid-interval between two transitions of received data dr. During the last three cycles of clock CLKref, the transition detection circuit indicates clock CLK3 to take into account the phase shift of the data and always take the "middle" sample.

Figure 4:
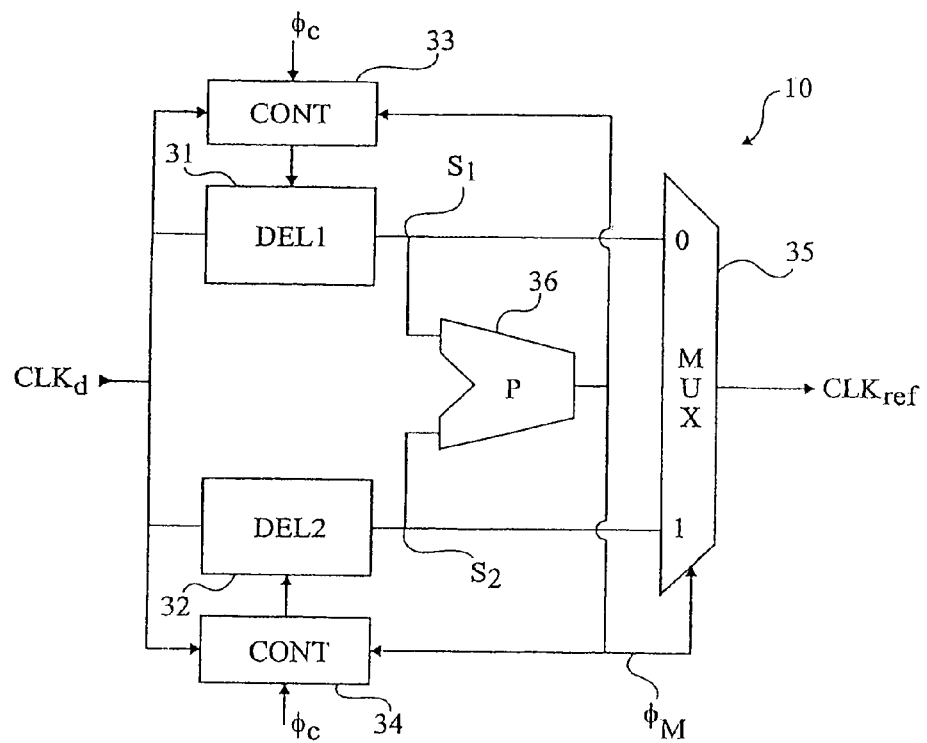
FIG. 4 is a diagram of an embodiment of the clock generation circuit of the receive circuit of the present invention.

FIG. 4 is a diagram of an example of a clock generation circuit 10 providing clock CLKref based on a base clock CLKd of frequency fd. Such a circuit is described in French patent application of the applicant No02/11418 filed on Sep.

13, 2002 (B5556) which is herein incorporated by reference. Circuit 10 comprises two settable delay means (DEL1) 31 and (DEL2) 32 that receive clock CLKd and respectively provide signals S1 and S2. Signal S1 is delayed with respect to clock CLKd by a delay DEL1 settable under control of a control circuit (CONT) 33. Signal S2 is delayed with respect to clock CLKd by a settable delay DEL2 under control of a control circuit (CONT) 34. A multiplexer (MUX) 35 receives signal S1 on its "0" input and signal S2 on its "1," input. A selection signal φM controls multiplexer 35 that provides clock CLKref. A phase comparator (P) 36 receives signals S1 and S2 and provides selection signal φM. Control circuits 33 and 34 are identical and receive clock CLKd, selection signal φM and control signal φC provided by filter circuit 19 and indicating the frequency desired for clock CLKref.

Figure 5:
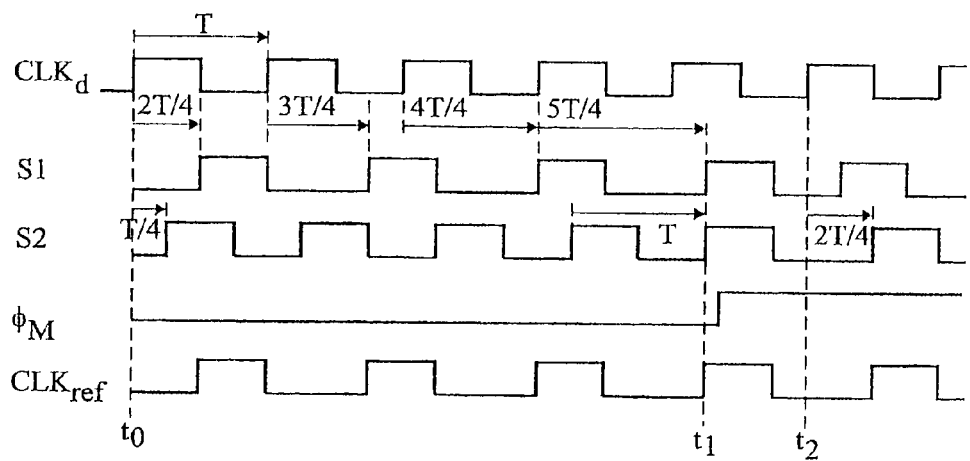
FIG. 5 illustrates signals of the circuit of FIG. 4.

FIG. 5 is a diagram of signals CLKd, S1, S2, φM and CLKref of the circuit of FIG. 4, in the case where the frequency of clock CLKref is smaller than that of clock CLKd. Clock CLKd is periodic, of period T, with in this example a 50% duty cycle. Six complete periods of CLKd are shown. Initially, at a time t0, selection signal φM is at level "0" and signal S1 is selected. Delay DEL2 of delay means 32 is minimum and equal to T/4. Delay DEL1 of delay means 31 progressively increases by T/4. The first shown rising edges of signal S1 and of clock CLKd are shifted by a half period (2T/4). The second rising edges of signal S1 and of clock CLKd are shifted by 3T/4. The third rising edges of signal S1 and of clock CLKd are shifted by T. The fourth rising edges of signal S1 and of clock CLKd are shifted by 5T/4.

During this time, signal S2 is shifted by T/4 with respect to clock CLKd. Multiplexer 35 provides signal S1 until the fourth rising edge of S1. At time t1, the rising edges of signals S1 and S2 corresponding to the shifting of the fourth rising edge of clock CLKd are shifted by a period T. Phase comparator 36 then switches selection signal φM from 0 to 1 and the multiplexer selects signal S2. At the next rising edge of clock CLKd, that is, the sixth rising edge shown at a time t2, delay DEL2 of delay means 32 is increased and the sixth rising edges of signal S2 and of clock CLKd are shifted by one half-period (2T/4), while delay DEL1 remains constant and equal to T/4.

Delay DEL2 increases until the rising edges of signals S1 and S2 corresponding to a same rising edge of clock CLKd are shifted by a period T. At this time, the selection reverses back.

The period of clock CLKref is thus equal in this example to one period T plus one quarter, that is, 5T/4. The frequency of clock CLKref is thus equal to 800 MHz when the frequency of clock CLKd is 1 GHz.

Phase comparator 36 of circuit 30 of FIG. 4 thus has the function of detecting the time when the rising edges of signals S1 and S2 corresponding to a same rising edge of clock CLKd are shifted by a duration greater than or equal to one period T. Phase comparator 36 then switches the level of selection signal φM. The previously-selected delay means takes a minimum delay (T/4). The delay of the newly-selected delay means increases.

Generally, phase comparator 36 can detect the time when determined transitions, a rising or falling edge, of signals S1 and S2 corresponding to a same transition of signal CLKd, are shifted by at least one period T.

Control circuits 33 and 34 may be formed by means of a finite state machine capable of increasing the delay of the selected delay means at the rate of clock CLKd and of positioning the other delay means on the minimum delay.

In the case where the frequency of dock CLKref is desired to be close to that of CLKd, or to vary relatively slowly, it may be difficult to form a delay means in which the delay can be increased by a very short duration, the limiting increment being 10 ps for modem technologies. An embodiment of the present invention then provides increasing the delay once every X cycles only. The higher number X, the closer the average frequency of clock CLKref is to clock CLK, and conversely. Number X can be adjusted to vary the frequency of clock CLKref.

Reference clock generation circuit 10 may be used to provide a clock CLKref of higher frequency than that of clock CLKd. For this purpose, delays DEL1 and DEL2 of delay means 31 and 32 will initially be maximum. Then, the delay of the selected delay means will be progressively decreased, the delay of the other delay means remaining maximum. When the two signals S1 and S2 are back in phase, the selection reverses.

Figure 6:
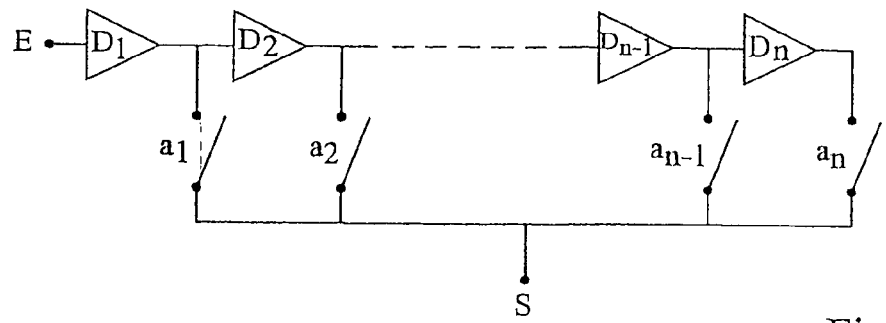
FIG. 6 is a diagram of an embodiment of the delay means.

FIG. 6 is a diagram of an embodiment of delay means 31 and 32 used in clock generation circuit 10 of FIG. 4. The delay means comprises n delay elements D1 to Dn in series, input E of the delay means being connected to the input of delay element D1. A delay element may for example be formed of two inverters in series. The output of a delay element Di, i ranging between 1 and n, is connected to output S of the delay means via a switch ai. The minimum delay between input E and output S is obtained by turning on switch a1 and turning off all the other switches. The delay between input E and output S may be progressively increased by successively selecting switches a2, a3, and so on.

The number of delay elements must be such that the difference between the maximum delay obtained by selecting switch an and the minimum delay obtained by selecting switch a1 is greater than one period T to ensure a proper operation of circuit 10. The selected delay means should indeed switch at the latest when the delay of the selected delay means is maximum.

There exist other more sophisticated delay means such as that described in French patent application 9711022 of the applicant, which is herein incorporated by reference.

Figure 7:
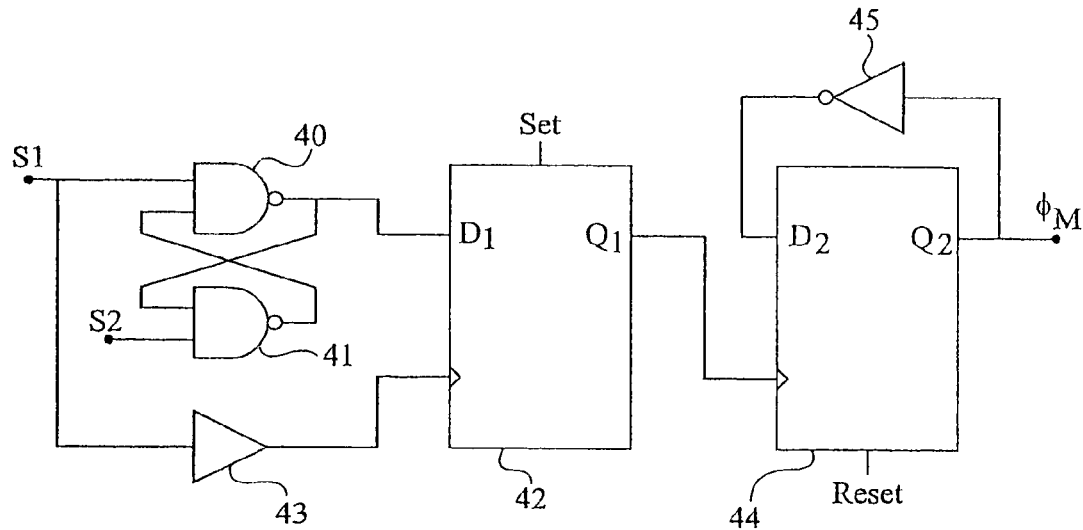
FIG. 7 is a diagram of an embodiment of a phase comparator.

FIG. 7 is a diagram of an embodiment of phase comparator 36 of clock generation circuit 10. Phase comparator 36 comprises two two-input NAND gates 40 and 41. The output of NAND gate 40 is connected to an input of NAND gate 41 and the output of NAND gate 41 is connected to an input of NAND gate 40. The second input of NAND gate 40 receives signal S1, and the second input of NAND gate 41 receives signal S2. Signal S1 is transmitted to the control input of a flip-flop 42 via a non-inverting circuit 43 exhibiting a given delay. The output of NAND gate 40 is connected to data input D1 of flip-flop 42. Output Q1 of flip-flop 42 controls a counter-assembled flip-flop 44, output Q2 of flip-flop 44 being connected to its data input D2 via an inverter 45. Output Q2 of flip-flop 44 provides selection signal φM that controls multiplexer 35 of circuit 10.

Outputs Q1 and Q2 of flip-flops 42 and 44 are initially set to "1" and "0" via, for example, initialization signals (set, reset). As long as signals S1 and S2 are shifted by less than one half-period (T/2), output Q1 of flip-flop 42 remains at 1. At the time when the offset of signals S1 and S2 exceeds one half-period, output Q1 of flip-flop 42 switches from 1 to 0. As long as the shifting of signals S1 and S2 remains between one half-period (T/2) and one period T, output Q1 of flip-flop 42 remains at 0. Then, when signals S1 and S2 are shifted by at least one period T, output Q1 of flip-flop 42 switches from 0 to 1. Output Q2 of flip-flop 44 switches state. Since selection signal φM switches state, the selection of multiplexer 35 reverses. Signals S1 and S2 then progressively shift back and output Q1 of flip-flop 42 switches back from 1 to 0 and from 0 to 1, and the multiplexer selection reverses back.

Such a clock generation circuit comprises digital elements with a very low sensitivity to temperature and power supply variations. Accordingly, clock CLKref has little noise, conversely to the dock generated by a tracking PLL.

Referring again to FIG. 2, the circuit 7 may be part of a data receiver, which in turn may be part of an electronic system, such as a computer system or communication system.

Of course, the present invention is likely to have various alterations, modifications, and improvements relative to the embodiments discussed above. In particular, other reference clock generation circuits, as well as other oversampling circuits, may be used.

Such alterations, modifications, and improvements are intended to be part of this disclosure, and are intended to be within the spirit and the scope of the present invention. Accordingly, the foregoing description is by way of example only and is not intended to be limiting.

What is claimed is:

1. A circuit for receiving digital data arriving in series comprising:
   a circuit for generating a reference clock, comprising
      two settable delay means receiving a base clock, the difference between the maximum and minimum delays of each delay means being greater than one period of the base clock,
      a multiplexer selecting the output signal of one or the other of the delay means,
      control means for, according to whether the reference clock frequency must be smaller or greater than the base clock frequency, increasing or decreasing at the rate of the base clock or at a multiple of this rate the delay of the selected delay means, and controlling a minimum or maximum delay for the non-selected delay means, and
      a phase comparator capable of changing the multiplexer selection when the transitions of the signals output by the delay means corresponding to a same transition of the base clock are shifted by a duration greater than or equal to one period of the base clock;
   a circuit for oversampling the received data memorizing the samples sampled at the rate of several clocks phase-shifted with respect to the reference clock, the oversampling circuit comprising means for selecting and providing as output data samples representative of the received data; and
   a detection circuit identifying the variations of the phase shift between the reference clock edges and the transitions of the received data by analyzing the memorized samples, the detection circuit controlling a variation of the reference clock frequency when the phase shift variations are repeated over several sampling cycles.

2. The circuit of claim 1, wherein the delay of the delay means varies by increments or decrements and wherein the control means comprise means for setting the increment or decrement value.

3. The circuit of claim 1, wherein each delay means comprises several delay elements in series, the output of each delay element being connected to the output of the delay means via a switch, the input of the first delay elements being connected to the input of the delay means.

4. The circuit of claim 1, wherein the phase comparator comprises two two-input NAND gates, the output of a NAND gate being connected to a first input of the other NAND gate, each NAND gate receiving on its second input one of the signals output by said delay means, one of these signals being transmitted to the control input of a first flip-flop via a non-inverting circuit exhibiting a delay, the output of one of the NAND gates being connected to the data input of the first flip-flop, the output of the first flip-flop controlling a second flip-flop having its output connected to its input via an inverter, the output of the second flip-flip controlling the multiplexer of the reference clock generation circuit.

5. The circuit of claim 1, wherein the delay of one of the delay means increases or decreases only for one or several cycles of a set of cycles of the input signal, the number of delay increases or decreases over a set of cycles being all the greater as the reference clock frequency is distant from the base clock frequency.

* * * * *

UNITED STATES PATENT AND TRADEMARK OFFICE
CERTIFICATE OF CORRECTION

PATENT NO. : 7,580,496 B2
APPLICATION NO. : 10/832803
DATED : August 25, 2009
INVENTOR(S) : Marbot et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1382 days.

Signed and Sealed this

Fourteenth Day of September, 2010

David J. Kappos
*Director of the United States Patent and Trademark Office*